Feb. 11, 1969 H. P. KLEINKNECHT 3,427,460

BEAM-OF-LIGHT TRANSISTOR UTILIZING P-N JUNCTIONS WHICH ARE NON-ABRUPT AND NON-TUNNELING WITH A BASE REGION OF DEGENERATE MATERIAL

Filed Sept. 10, 1964

INVENTOR.
HANS P. KLEINKNECHT
BY
W. S. Hill
AGENT

United States Patent Office 3,427,460

Patented Feb. 11, 1969

3,427,460

BEAM-OF-LIGHT TRANSISTOR UTILIZING P-N JUNCTIONS WHICH ARE NON-ABRUPT AND NON-TUNNELING WITH A BASE REGION OF DEGENERATE MATERIAL

Hans P. Kleinknecht, Bergdietikon, Aargau, Switzerland, assignor to Radio Corporation of America, a corporation of Delaware Filed Sept. 10, 1964, Ser. No. 395,419

U.S. Cl. 250—211 5 Claims

Int. Cl. H01j 39/12

Figures 1, 2, 3, 4, 5:
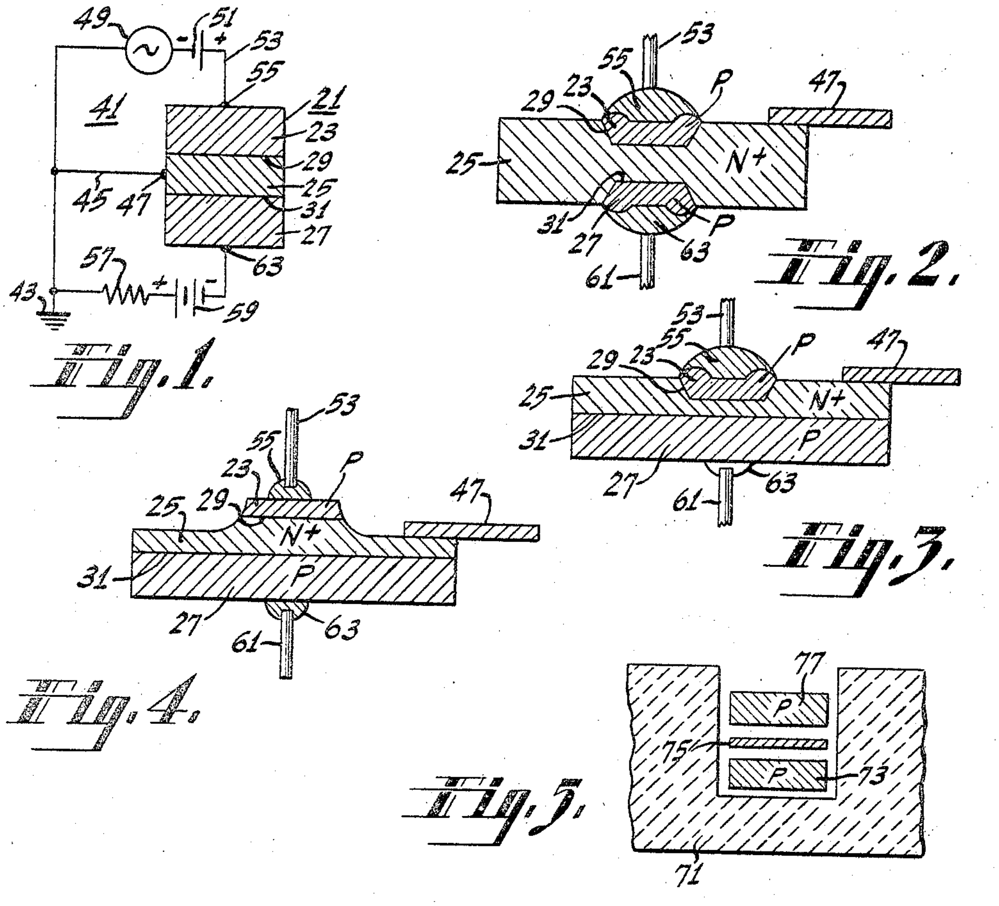

This invention relates to an improved transistor in which the input at the emitter is coupled optically to the output at the collector.

A transistor in which the input at the emitter is coupled optically to the output at the collector is described by R. H. Rediker et al., in the Proceedings of the IEEE, 51, 218 (1963), and is referred to as a beam-of-light transistor or an optical transistor. This prior device comprises a base of semiconductor material, an emitter (emitter-base) P-N junction therein adapted for generating recombination radiation in response to a forward voltage applied across the emitter junction, and a collector (collector-base) P-N junction therein adapted for generating a photocurrent in response to the recombination radiation from the emitter junction which is incident on the collector junction. In this structure, the input and output are not coupled with minority charge carriers traversing the base from emitter to collector as in conventional transistors. Instead, photons, which are generated at the input, traverse the base and are absorbed adjacent the collector junction producing an output photocurrent. The photons are produced by recombination of minority carriers which are injected adjacent the emitter junction. The recombination takes place rather close to the emitter junction and it is these photons which traverse the base to the collector. The amplitude of the output current is a function of the amplitude of the inppt voltage applied across the emitter junction.

Some advantages of the beam-of-light transistor over conventional transistors are that (1) the base can be of a material having a short minority carrier lifetime, (2) the base may be wider between the emitter and collector junctions, (3) the injection of minority carriers at the emitter junction may either be from the emitter into the base or from the base into the emitter, and (4) the upper limit of frequency response of the device is determined by the transit time of photons in the base instead of the transit time of the minority carriers in the base. In order to improve the efficiency of the beam-of-light transistor, it is desirable to reduce the absorption of photons in the base and to enhance the absorption of photons near the collector junction. For this reason, Rediker et al., op cit, suggests using a P-type GaAs/N-type GaAs/P-type Ge structure in which the emitter junction is a P-N GaAs homojunction and the collector junction is an N-type GaAs/P-type Ge heterojunction. In this prior structure, photons from the emitter junction are absorbed in the germanium within about a micron of the collector junction.

An object of this invention is to provide an improved beam-of-light transistor.

A further object is to provide a beam-of-light transistor in which absorption of photons from the emitter junction is reduced in the base and is enhanced adjacent the collector junction.

A further object is to provide an improved beam-of-light transistor in which there are no heterojunctions.

The improved beam-of-light transistor of the invention comprises a body of semiconductor material, an emitter P-N junction therein adapted for generating recombination radiation in response to a forward voltage applied across the emitter junction, and a collector P-N junction therein adapted for generating a photocurrent in response to recombination radiation generated at the emitter junction. The body, or base, is of a semiconductor material in which the ratio of the effective mass of the free charge carriers therein to the mass of an electron in free space is less than 0.15. The body material contains a high concentration of conductivity-type-determining impurities sufficient to cause a net shift in the absorption band edge toward shorter wavelength.

The improved transistor described herein uses as the base a highly doped semiconductor material whose absorption band edge shifts toward shorter wavelengths with such high doping. Thus, the base (which is highly doped) is transparent, and the emitter and collector regions (which are less highly doped) are absorbing for the wavelengths over which the absorption edge has shifted. Recombination radiation generated at the input is within these wavelengths. Thus, the photon absorption in the base is reduced, permitting an enhanced photon absorption adjacent the collector junction.

In addition, both of these advantages may be achieved using only homojunctions in the device, although similar advantages may be achieved with heterojunctions at one or both of the emitter and collector junctions.

Figure 6:
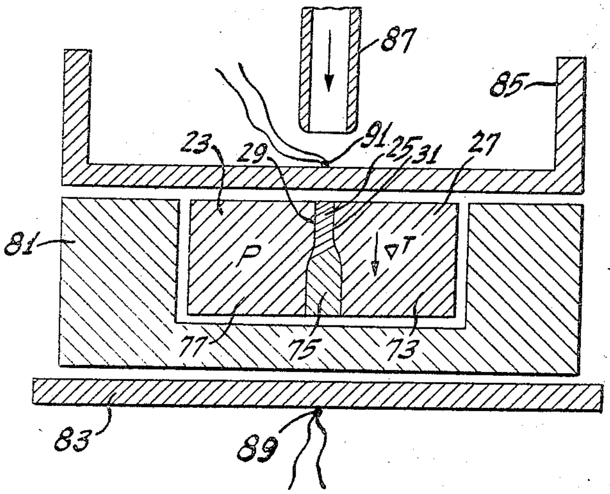

A more detailed description of the invention and illustrative embodiments thereof appear below in conjunction with the drawing in which FIGURE 1 is a schematic sectional view of a device and circuit of the invention, FIGURE 2 is a sectional view of an embodiment of the invention having two alloy junctions, FIGURE 3 is a sectional view of an embodiment of the invention having an alloy emitter junction and a diffused collector junction, FIGURE 4 is a sectional view of an embodiment of the invention having an epitaxially-grown emitter junction and a diffused collector junction, FIGURE 5 is a broken away sectional view of a jig being used to carry out a preliminary step in a process for making a device of FIGURE 1, and FIGURE 6 is a sectional view of another jig being used to fabricate the base region and homojunctions of the device of FIGURE 1 by recrystallization of semiconductor material.

Similar reference numerals are used for similar structural elements throughout the drawing.

FIGURE 1 includes a transistor 21 of the invention shown schematicaly and in section for purposes of illustration. The transistor 21 includes an emitter region 23 of P-type semiconductor material, a base region 25 of N-type semiconductor material, and a collector region 27 of P-type semiconductor material. The interface between the emitter and base regions 23 and 25 defines an emitter junction 29, and the interface between the base and collector regions 25 and 27 defines a collector junction 31. The junctions should not be abrupt in order to avoid tunneling of the carriers through the junctions. An abrupt junction is defined for this purpose as one less than 200 angstrom units thick. The various regions are preferably of the same or substantially of the same semiconductor material except that they may differ as to conductivity type as described. However, the various regions may be of different semiconductor materials.

The semiconductor material of the emitter region 23 and of the collector region 27 have doping concentrations ordinarily used in conventional transistors. The emitter and collector regions also are generally of the size and thickness used in conventional transistors. And, the emitter junction 29 and the collector junction 31 each has an area and thickness used in conventional transistors.

The semiconductor material of the base is of the type in which the fundamental absorption edge shifts to shorter wavelengths with increased doping. This shift of the absorption edge with increased doping is sometimes called the Burstein shift and is described by Elias Burstein in Physical Review, 93, 632 (1954). The Burstein shift occurs mainly in semiconductors with a small effective mass of electrons, such as indium antimonide (InSb), and indium arsenide (InAs). By small effective mass, is meant that the ratio of the effective mass of a free charge carrier in the material to the mass of an electron in free space is less than 0.15. In semiconductor materials in which this relationship holds, the charge carrier have extremely high electron mobilities which helps to reduce the resistance in the base. Also, in such semiconductor materials, the diffusion length of a minority charge carrier is generally very short. Also, in such semiconductor materials, the optical absorption at the band edge as well as the recombination radiation is due to direct transitions of electrons with minimal losses of energy due to photon generation.

The semiconductor material of the base region 25 is highly doped, preferably to degeneracy, so that the Fermi level in the material is in the conduction band in the case of N-type material, or is in the valence band in the case of P-type material. Some suitable semiconductors and the corresponding lower limit of free charge carrier concentration for the base are as follows:

| | Carriers/cm.$^3$ |
|---|---|
| N-type gallium arsenide | $4\times10^{17}$ |
| N-type indium arsenide | $8\times10^{16}$ |
| N-type indium phosphide | $4\times10^{17}$ |
| N-type indium antimonide (at 77° k.) | $4\times10^{16}$ |

As pointed out above, the emitter and collector regions 23 and 27 each may be of the same or of different semiconductor materials from that of the base, but each are of the opposite conductivity type from that of the base region 25, and each have free charge carrier concentrations of such a magnitude that the Burstein shift is smaller than in the base region 25.

The thickness of the base region 25 between the emitter junction 29 and the collector junction 31 is generally greater than a diffusion length for minority carriers in the base region 25. When the thickness of the base region 25 approaches that of a diffusion length for minority carriers, the chance of minority carrier collection by the collector increases. This is an undesirable effect in the device described herein because the transit time for minority charge carriers is different from that of photons and therefore minority carrier collection may adversely affect the fidelity of the output signal. The thickness of the base region 25 may be as great as desired, bearing in mind that the greater the thickness, the greater will be the photon absorption in the base region 25.

FIGURE 1 includes also a circuit 41 for operating the device 21. The circuit 41 shows the base region 25 connected to ground 43 through a base lead 45 and a base connection 47. The emitter region 23 is connected serially to ground 43 through a signal source 49, an emitter bias source 51, an emitter lead 53, and an emitter connection 55. The collector region 27 is connected serially to ground 43 through a load 57, a collector bias source 59, a collector lead 61 and a collector connection 63.

Considering the device 21 to be a P-N-P structure, when the emitter junction 29 is forward-biased, (that is, the emitter region 23 is positive with respect to the base region 25), carriers injected at or near the emitter junction 29 recombine, yielding recombination radiation, which are photons having a frequency approximately that of the band edge of the semiconductor. The carriers may be injected from the emitter region 23 into the base region 25 or from the base region 25 into the emitter region 23. In either case, the number of photons produced by recombination is a function of the forward bias across the emitter junction 29. The photons pass through the base region 25 at the speed of light in the base region 25 to the collector region 27 where they are absorbed. The absorption of the photons generates free charge carriers adjacent the collector junction 31, which carriers are collected at the collector junction 31 producing a photovoltaic voltage and a photocurrent. The collector junction 31 is preferably back-biased (that is, the collector region is negative with respect to the base region 25) for the purpose of improving the collection efficiency at the collector junction 31.

The recombination radiation produced at the emitter junction 29 has a frequency essentially corresponding to the bandgap of the semiconductor. The collector region 27 can absorb such radiation within a diffusion length for minority charge carriers of the collector junction 31. However, the base region 25 by virtue of being of a highly doped semiconductor of a particular class as described above, transmits this recombination radiation with relatively little loss.

Instead of a P-N-P structure, an N-P-N structure may also be used. In operating an N-P-N structure, all of the polarities are reversed from that described above in order to forward bias the emitter junction and to back bias the collector junction. The operation is otherwise the same.

Various embodiments of the transistor described herein may be provided. The device illustrated in FIGURE 2 has emitter and collector regions and junctions formed by alloying. In a typical device, the starting material may be degenerate N-type InSb or InAs. The collector and emitter junctions may be made by an alloying process using indium dots containing an acceptor impurity and by subsequent diffusion to smooth the impurity concentrations near the junction in order to avoid tunneling.

In another arrangement, shown in FIGURE 3, the emitter junction is produced by alloying and the collector junction is produced by diffusion. For example, one may start with a high resistivity P-type gallium arsenide crystal, and produce by diffusion an N+ layer adjacent one surface. This step is followed by out-diffusing a portion of the diffused surface layer and alloying the emitter region as described with respect to FIGURE 2. Then the device is heated to diffuse impurities therein to smooth the impurity concentrations near the junctions to avoid carrier tunneling as described with respect to FIGURE 2.

In still another arrangement illustrated in FIGURE 4, the base 25 and the collector junction 31 are produced by diffusion as described with respect to FIGURE 3. Then, the emitter region 23 is produced on top of this by epitaxial growth. The junction areas are defined by etching. One may start with a high resistivity P-type crystal of gallium arsenside, and produce by diffusion and N+ layer adjacent a surface of the crystal. Then, a P-type high resistivity layer of gallium arsenide is deposited upon the N+ layer by epitaxial growth. Using a photographic etching technique, a mesa is produced defining the emitter junction 29 and exposing a portion of the base region 25. A base connection is then made to an exposed portion of the base region 25 by alloying thereto a suitable metal such as tin.

In any of the foregoing embodiments, indium antimonide may be used as a semiconductor. Devices of indium antimonide are used at liquid nitrogen temperatures and colder. Here the absorption edge is at about 5.5 microns for the pure material. Hence, this will be the approximate wavelength of the photons produced by recombination. If the base 25 also consisted of pure material, the photons would be absorbed within one micron of the point of recombination. If the base region 25 is doped to degeneracy, for instance to contain $5\times10^{17}$ donors/cm.$^3$, the absorption edge is at about 3.4 microns. Therefore, the absorption of the 5.5 micron photons is given mainly by the free carrier absorption, which is, for $5\times10^{17}$ electrons/cm.$^3$, about cm.$^{-1}$. In other words, the base region can be almost 0.1 mm. thick before photon absorption becomes a serious consideration.

Indium arsenide can be used in any of the embodiments at temperatures of Dry Ice and colder. It may be possible to use indium arsenide devices at room temperature. At room temperature, the absorption edge of pure indium arsenide, and hence the wave length of photons produced by recombination, is about 3.5 microns. A base region doped to have about $3\times10^{18}$ donors/cm. $^3$ has an absorption edge of about 2.4 microns. A comparison with the free carrier absorption quoted above for indium antimonide gives an estimate of about 40 cm.$^{-1}$ for indium arsenide containing $3\times10^{18}$ electrons/cm.$^3$ at room temperature, which permits slightly less than 0.1 mm. for the maximum base thickness.

The foregoing values for doping and thickness in the base region are well within the present state of the art.

The beam-of-light transistor described herein may also be made by a temperature gradient zone melting technique. The method consists of two steps. First, as shown in FIGURE 5, a sandwich is made by alloying a sheet 75 of a suitable metal between two high resistivity P-type semiconductor wafers 73 and 77. The metal of the sheet 75 is of the type which is an N-type impurity in the semiconductor or contains such impurities as a component. This sandwich may be made by alloying in a graphite jig 71, and may include the use of a flux and/or in a reducing atmosphere.

Then, in a second step, as shown in FIGURE 6, the sandwich is placed in another jig 81, where it is heated with a temperature gradient in the direction of the sandwich plane (the plane of the major surface of the metal sheet 75). The apparatus shown in FIGURE 6, includes a heater strip 83 beneath the jig 81, and a cooling fin 85 over the jig 81. The tube 87 for blowing cooling gas at the fin 85 is placed above the cooling fin 85. Thermocouples 89 and 91 at the heater strip 83 and the cooling fin 85 respectively are positioned so that the temperature gradient therebetween may be determined. The entire assembly is operated in reducing atmosphere.

The strip 83 is heated to such a temperature and the flow of cooling gas is so adjusted, that a constant temperature gradient parallel to the sandwich plane is established. The temperture at the hotter side of the sandwich (the side towards the strip) has to be lower than the melting or decomposition temperature of the semiconductor. The temperature at the colder side of the sandwich (the side towards the cooling fin) has to be higher than the melting point of the sheet 75.

The molten metal of the sheet 75 dissolves some of the semiconductor material from the hotter (bottom) side of the adjacent wafers 73 and 77. This semiconductor material is transported by diffusion along the liquid sheet to the colder (top) side where it supersaturates the solution and recrystallizes out as highly doped semiconductor material and forms P-N junctions with the adjacent wafers. As the goes on, more and more semiconductor material is dissolved at the hot end and is crystallized out at the cold end of the metal sheet. This causes a solid, highly-doped semiconductor layer to grow between the semiconductor wafers 73 and 77 from the top on down, while the liquid metal of the sheet 75 is forced to migrate to the hotter side (downward).

In FIGURE 6, there is shown a cross section of the sandwich partially processed. The lower portion of the sheet 75 still consists of molten metal which has dissolved a portion of the material from the adjacent semiconductor wafers 73 and 77. The upper portion of the sheet 75 has recrystallized, as a highly doped semiconductor 25, and emitter and collector junctions 29 and 31 have formed.

After the central region has completely recrystallized, the complete sandwich is removed from the jig 81. Connections are applied to the finished structure in the conventional way. One connection is applied to each of the P-type regions 23 and 27 (emitter and collector) and one connection is made to the N-type layer (base). The latter connection can be made either directly to the metal at the bottom side, or after removing the excess metal, to the narrow part of N-type layer directly. The procedure may be carried out using indium arsenide or indium antimonide as semiconductors in combination with a sheet of indium metal containing up to 10 percent tellurium or of tin metal. Good results have been obtained by heating a sandwich of indium metal containing 10 percent tellurium between wafers of indium arsenide for 19 hours with top and bottom temperatures of 690° C. and 750° C., respectively. The indium arsenide wafers were 1 x 1 x 1.5 mm. in size, the indium sheet 1 x 1.5 x .05 mm.

What is claimed is:

1. A semiconductor device comprising:

a body of semiconductor material including emitter, base and collector regions;

a first P-N junction between said emitter and base regions for generating recombination radiation in response to a forward voltage applied across said first junction, and a second P-N junction therein between said base and collector regions for generating a photocurrent in response to said generated recombination radiation, both of said junctions being non-abrupt and non-tunneling, a base region disposed between said junctions, the thickness of said base region being greater than a diffusion length for minority carriers therein and said region being composed of a degenerate semiconductor in which the ratio of the effective mass of a free charge carrier therein to the mass of an electron in free space is less than 0.15 and the optical absorption at the band edge is due to direct transitions without change of crystal momentum; and said emitter and collector regions being composed of non-degenerate material.

2. A semiconductor device as in claim 1 in which said base region is composed of gallium arsenide.

3. A semiconductor device as in claim 1 in which said base region is composed of indium aresnide.

4. A semiconductor device as in claim 1 in which said base region is composed of indium phosphide.

5. A semiconductor device as in claim 1 in which said base region is composed of indium antimonide.

References Cited

UNITED STATES PATENTS

| | | | |
|---|---|---|---|
| 3,043,958 | 7/1962 | Diemer | 250—217 |
| 3,229,104 | 1/1966 | Rutz | 250—217 |
| 3,245,002 | 4/1966 | Hall | 317—235 |

OTHER REFERENCES

Burstein: Physical Review, Ser. 2, vol. 93; 2.54; pp. 632, 633(QC–1–P4).

Dill, Jr.: IBM Technical Disclosure Bull.; vol. 6; No. 2; July 1963, pp. 84, 85.

Dill, Jr.: IBM Technical Disclosure Bull.; vol. 6; No. 5; October, 1963, p. 73.

Rediker: Proceedings of the IEEE; vol. 51; January 1963, pp. 218, 219.

RALPH G. NILSON, *Primary Examiner.*

T. N. GRIGSBY, *Assistant Examiner.*

U.S. Cl. X.R.

250—217; 317—235